United States Patent
Ker et al.

(10) Patent No.: US 8,525,265 B2
(45) Date of Patent: Sep. 3, 2013

(54) ELECTROSTATIC DISCHARGE PROTECTION CIRCUIT

(75) Inventors: Ming-Dou Ker, Hsinchu County (TW); Chun-Yu Lin, Hualien County (TW); Chang-Tzu Wang, Taipei (TW)

(73) Assignees: United Microelectronics Corp., Hsinchu (TW); National Chiao Tung University, Hsinchu (TW)

( * ) Notice: Subject to any disclaimer, the term of this patent is extended or adjusted under 35 U.S.C. 154(b) by 266 days.

(21) Appl. No.: 12/705,339

(22) Filed: Feb. 12, 2010

(65) Prior Publication Data
US 2011/0198678 A1  Aug. 18, 2011

(51) Int. Cl.
    *H01L 23/62*   (2006.01)
(52) U.S. Cl.
    USPC ............ 257/355; 257/360; 257/363; 257/365
(58) Field of Classification Search
    USPC .................. 257/360, 355, 363, 365
    See application file for complete search history.

(56) References Cited

U.S. PATENT DOCUMENTS

| | | | |
|---|---|---|---|
| 5,654,862 A | 8/1997 | Worley et al. | |
| 5,901,022 A | 5/1999 | Ker | |
| 5,946,175 A | 8/1999 | Yu | |
| 6,300,668 B2 * | 10/2001 | Miller et al. | 257/536 |
| 6,885,529 B2 | 4/2005 | Ker et al. | |
| 6,963,110 B2 | 11/2005 | Woo et al. | |
| 7,233,467 B2 | 6/2007 | Mergens et al. | |
| 2003/0043523 A1 * | 3/2003 | Hung et al. | 361/111 |
| 2003/0201457 A1 * | 10/2003 | Lin et al. | 257/173 |
| 2008/0061843 A1 * | 3/2008 | Yanci | 327/78 |
| 2008/0062598 A1 | 3/2008 | Chen et al. | |
| 2010/0165523 A1 * | 7/2010 | Son | 361/56 |

* cited by examiner

*Primary Examiner* — Jae Lee
(74) *Attorney, Agent, or Firm* — WPAT, PC; Justin King

(57) ABSTRACT

An electrostatic discharge (ESD) protection circuit, suitable for an input stage circuit including a first N channel metal oxide semiconductor (NMOS) transistor, is provided. The ESD protection circuit includes an P channel metal oxide semiconductor (PMOS) transistor and an impedance device, in which the PMOS transistor has a source coupled to a gate of the first NMOS transistor, and a drain coupled to a source of the first NMOS transistor, and the impedance device is coupled between a gate of the PMOS transistor and a first power rail to perform a initial-on ESD protection circuit. The ESD protection circuit formed by the PMOS transistor and the resistor is capable of increasing the turn-on speed of the ESD protection circuit and preventing the input stage circuit from a CDM ESD event.

8 Claims, 8 Drawing Sheets

ELECTROSTATIC DISCHARGE PROTECTION CIRCUIT

BACKGROUND OF THE INVENTION

1. Field of the Invention

The present invention generally relates to an electrostatic discharge (ESD) protection circuit, in particular, to a Charged-Device Model (CDM) ESD protection circuit.

2. Description of Related Art

An ESD event refers to a phenomenon of electrical discharge of a current for a short duration during which a large amount of current is provided to a semiconductor integrated circuit (IC). ICs are generally susceptible to ESD events, which may damage or destroy the integrated circuit. Thus, ESD protection of ICs is a critical factor in obtaining high yield and stable IC characteristics. The susceptibility of a device to ESD can be determined by testing each one of three models which include Human Body Model (HBM), Machines Model (MM) and Charged-Device Model (CDM).

With regard to a CDM ESD event, electrostatic charge could be stored within the body of an IC product due to induction or tribocharging and most of the charge is accumulated in a substrate, including a base, a body or a well of the devices disposed on the IC, and is uniformly distributed in the substrate. Once a certain pin of the IC is suddenly grounded, the electrostatic charge originally stored within the IC will discharge through the grounded pin. This is called the CDM ESD event. The CDM ESD event delivers a large amount of current in a very short time, and in general the entire ESD event can take place in less than 2 nanoseconds (ns). Current levels can reach several tens of amperes during discharge, which are remarkably greater than those of the HBM and MM models.

Additionally, there are many situations where the pins of an IC may become grounded, for example, the pin may touch grounded metallic surface or the pin may be touched by grounded metallic tools. Different ICs have different die sizes, so their equivalent parasitic capacitances are totally different from one another. Thus, different ICs have different peak current and different CDM ESD levels. When a device under test (DUT) with the equivalent capacitance of 4 pF is under a 1-kV CDM ESD test, the CDM ESD current can rise to more than 15 A within several nanoseconds. Compared with HBM and MM ESD events, the discharging current in a CDM ESD event is not only larger, but faster. Since the duration of CDM ESD events is much shorter than HBM and MM ESD events, the internal circuit may be damaged during CDM ESD events before the ESD protection circuit is turned on.

SUMMARY OF THE INVENTION

Accordingly, the present invention is directed to ESD protection circuits with an initial-on mechanism. The ESD protection circuits are implemented by an additional P channel metal oxide semiconductor (PMOS) transistor and a resistor coupled between a gate of the PMOS transistor and a power rail. The ESD protection circuits can provide efficient CDM protection for input stages in general nanoscale CMOS process.

The present invention is directed to an electrostatic discharge (ESD) protection circuit, suitable for an input stage circuit including a first N channel metal oxide semiconductor (NMOS) transistor. The ESD protection circuit comprises a PMOS transistor and an impedance device (for example, a resistor), wherein the PMOS transistor has a source coupled to a gate of the first NMOS transistor, and a drain coupled to a source of the first NMOS transistor, and the impedance device is coupled between a gate of the PMOS transistor and a first power rail.

According to an embodiment of the present invention, the drain of the PMOS transistor is directly coupled to a heavily doped N-type (N+) diffusion region used to form the source of the first NMOS transistor, and coupled to a first ground rail through the N+ diffusion region.

According to an embodiment of the present invention, the ESD protection circuit further comprises a capacitor coupled to the impedance device and a first ground rail, wherein the gate of the PMOS transistor is coupled to a common node of the impedance device and the capacitor.

According to an embodiment of the present invention, the ESD protection circuit further comprises an inverter and a transistor, wherein the inverter is coupled to the first power rail and the first ground rail, and has an input terminal coupled to the common node of the capacitor and the impedance device, and an output terminal coupled to a gate of the transistor which has a source and a drain coupled to the first power rail and the first ground rail respectively. The capacitor, the impedance device, the inverter and the transistor form a power-rail ESD clamp circuit.

According to an embodiment of the present invention, the source of the first NMOS transistor is coupled to a first ground rail, and the gate of the first NMOS transistor is coupled to an input pad.

According to an embodiment of the present invention, the ESD protection circuit further comprises a diode which has an anode coupled to the source of the first NMOS transistor, and a cathode coupled to a first ground rail.

According to an embodiment of the present invention, the ESD protection circuit further comprises a second NMOS transistor which has a drain coupled to the source of the first NMOS transistor, and a source coupled to a first ground rail, and a gate coupled to the first power rail.

According to an embodiment of the present invention, the ESD protection circuit further comprises a resistor coupled between the gate of the first NMOS transistor and an input pad.

According to an embodiment of the present invention, the ESD protection circuit further comprises a first ESD clamp circuit, a second ESD clamp circuit and a third ESD clamp circuit. The first ESD clamp circuit is coupled to a second power rail and the input pad. The second ESD clamp circuit is coupled to a second ground rail and the input pad. The third ESD clamp circuit is coupled to a first ground rail and the second ground rail.

According to an embodiment of the present invention, the input stage circuit further comprises a first PMOS transistor which has a source coupled to the first power rail, and a drain coupled to a drain of the first NMOS transistor, and a gate coupled to the gate of the first NMOS transistor.

According to an embodiment of the present invention, wherein the PMOS transistor has a body coupled to the source of the PMOS transistor.

As described above, in the present application, a circuit formed by a PMOS transistor and a resistor serves as a CDM ESD protection circuit. The ESD protection circuit has an initial-on mechanism by connecting a gate of the PMOS transistor to a power rail through the resistor so that the turn-on speed of the ESD protection circuit is enhanced and efficient CDM ESD protection performance is achieved.

BRIEF DESCRIPTION OF THE DRAWINGS

The accompanying drawings are included to provide a further understanding of the invention, and are incorporated

DESCRIPTION OF THE EMBODIMENTS

Figure 1:
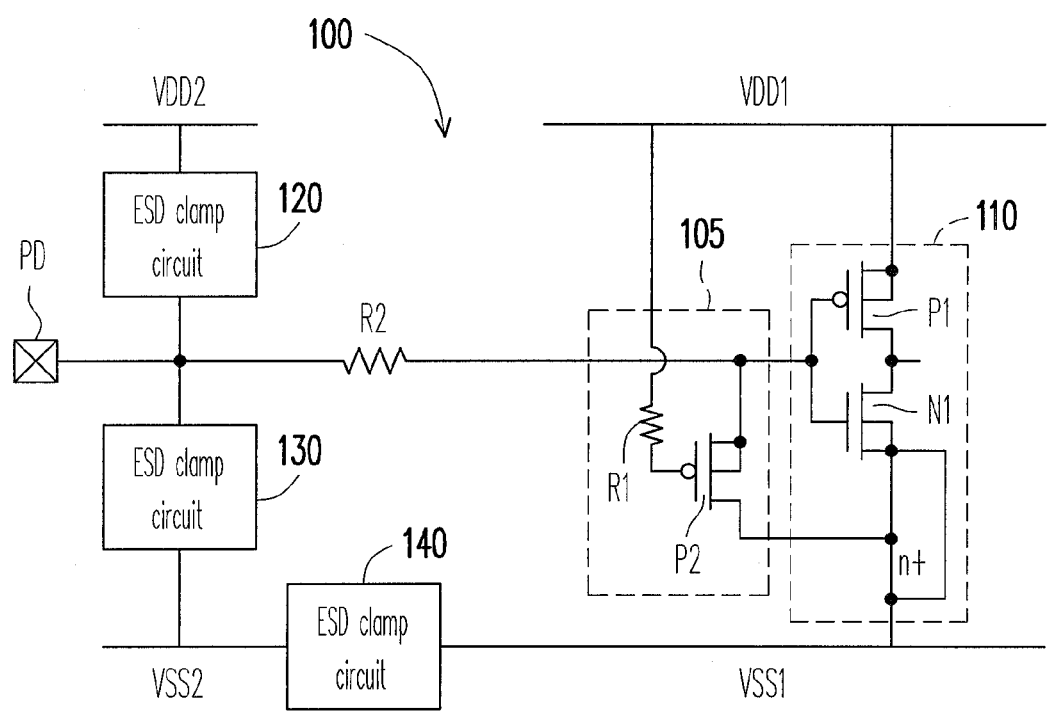
FIG. 1 shows a circuit diagram capable of ESD protection in accordance with a first embodiment of the application.

Reference will now be made in detail to the present preferred embodiments of the invention, examples of which are illustrated in the accompanying drawings. Wherever possible, the same reference numbers are used in the drawings and the description to refer to the same or like parts.

First Embodiment

FIG. 1 shows a circuit diagram capable of ESD protection in accordance with a first embodiment of the application. Referring to FIG. 1, a circuit 100 includes an input stage circuit 110, a PMOS transistor P2, two resistors R1 and R2, and ESD clamp circuits 120, 130 and 140, wherein the input stage circuit 110 further includes a first PMOS transistor P1 and a first NMOS transistor N1. The first PMOS transistor P1 has a source and a body both coupled to a first power rail VDD1, and a drain coupled to a drain of the first NMOS transistor N1. The first NMOS transistor N1 has a source and a body both coupled to a first ground rail VSS1, and a gate coupled to a gate of the first PMOS transistor P1. The resistor R2 is coupled between the gate of the first PMOS transistor P1 and an input pad PD. It is noted that the resistor R2 is not necessary in the circuit 100, the input stage circuit 110 can directly connect to the input pad PD without the resistor R2.

The ESD clamp circuit 120 is coupled between a second power rail VDD2 and the input pad PD. The ESD clamp circuit 130 is coupled between the input pad PD and a second ground rail VSS2, and the ESD clamp circuit 140 is coupled between the first ground rail VSS1 and the second ground rail VSS2. The ESD clamp circuits 120~140 disposed near the input pad PD are capable of providing HBM and MM ESD protection for the input stage circuit 110. The PMOS transistor P2 has a source and a body both coupled to the gates of the first NMOS transistor N1 and the first PMOS transistor P1, and a drain directly coupled to a heavily doped N-type (N+) diffusion region which is used to form the source of the first NMOS transistor N1. Therefore, the drain of the PMOS transistor P1 is coupled to the first ground rail VSS1 through the N+ diffusion region which functions to serve as a resistor between the drain of the PMOS transistor P1 and the first VSS1. The resistor R1 is coupled between the gate of the PMOS transistor P2 and the first power rail VDD1 to perform a self-biased PMOS transistor P2.

When no power is supplied to the first power rail VDD1, the gate of the PMOS transistor P2 has a low voltage level, and the PMOS transistor P2 would be immediately turned on and conducts a portion of an ESD current to the first ground rail VSS2 or the input pad PD to avoid the ESD current damaging an internal circuit as the input pad PD is suddenly grounded and a CDM ESD event occurs. The PMOS transistor P2 has an initial-on mechanism by connecting the gate of the PMOS transistor P2 to the first power rail VDD1 through the resistor R1. Therefore, the PMOS transistor P2 has the effect of high turn-on speed and instantly conducting the ESD current as the CDM ESD event occurs. When an operation voltage is supplied to the first power rail VDD1, the gate of the first PMOS transistor P2 has a high voltage level and then the first PMOS transistor P2 would be turned off automatically to avoid affecting the signal transmitted through the input pad PD. Accordingly, a self-biased circuit is formed by the PMOS transistor P2 and the resistor R1 and is capable of preventing the CDM ESD from damaging the internal circuit. Accordingly, including the ESD protection circuit formed by the ESD clamp circuits 120~140, the PMOS transistor P2 and R1 is capable of providing a HBM and MM and CDM ESD protection for the input stage circuit 110. It is noted that the ESD protect circuit formed by the PMOS transistor P2 and resistor R1 can be applied to the circuit 100 by itself to provide CDM ESD protection.

Second Embodiment

Figure 2A:
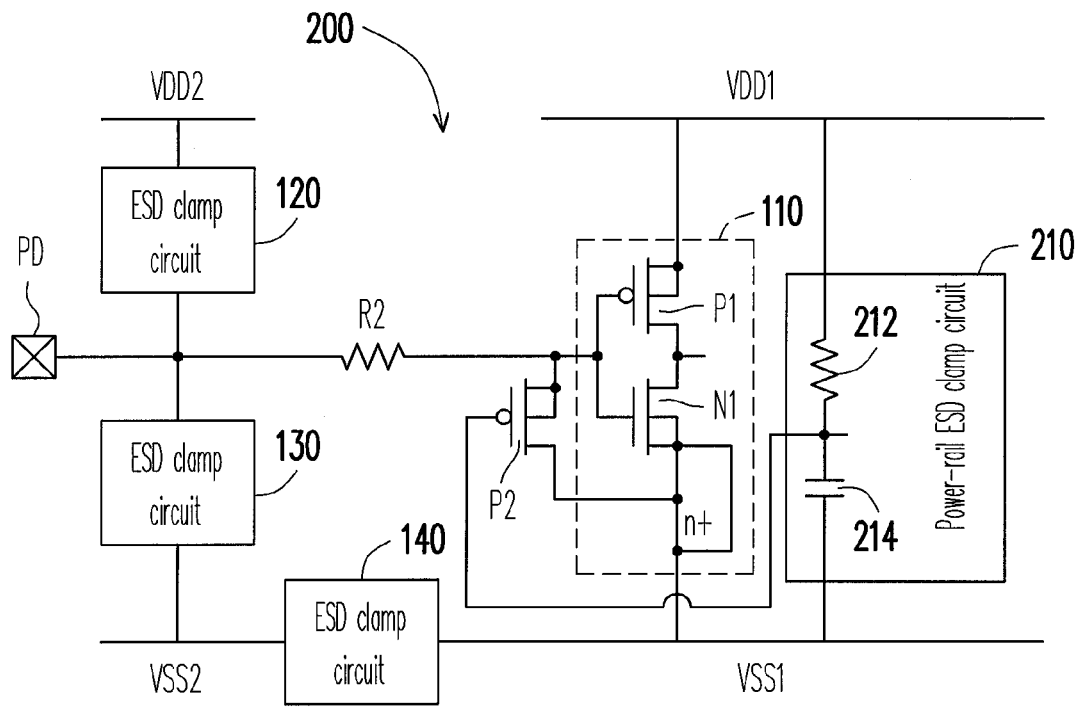
FIG. 2A shows a circuit diagram capable of ESD protection in accordance with a second embodiment of the application.

The resistor R1 of FIG. 1 can be replaced with a resistor of a power-rail ESD clamp circuit. FIG. 2A shows a circuit diagram capable of ESD protection in accordance with a second embodiment of the application. Referring to FIG. 2A and FIG. 1, the difference between a circuit 200 and the circuit 100 is mainly a power-rail ESD clamp circuit 210, as shown in FIG. 2A. The power-rail ESD clamp circuit 210 is coupled between the first power rail VDD1 and the first ground rail VSS1, and capable of providing ESD protection for the first power rail VDD1 and the first ground rail VSS1. The power-rail ESD clamp circuit 210 includes a resistor 212 and a capacitor 214, in which the resistor 212 and a capacitor 214 are connected in series between the first power rail VDD1 and the first ground rail VSS1. The gate of the PMOS transistor P2 is coupled to a common node of the resistor 212 and the capacitor 214, and therefore coupled to the first power rail VDD1 through the resistor 212.

Figure 2B:
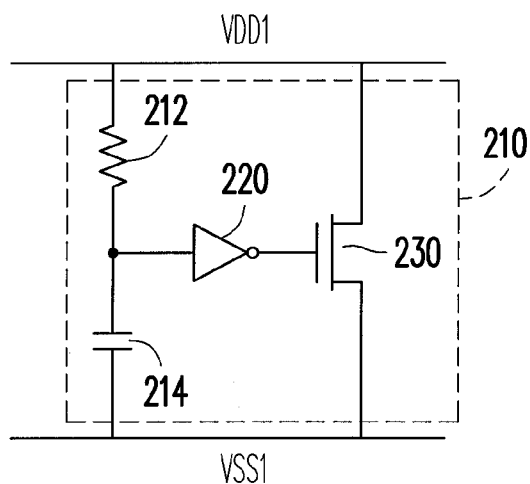
FIG. 2B shows a schematic diagram of the power-rail clamp circuit 210 in accordance with the second embodiment of the application.

The circuit structure of the power-rail ESD clamp circuit 210 can be implemented in a variety of ways. Please refer to the FIG. 2B. FIG. 2B shows a schematic diagram of the power-rail clamp circuit 210 in accordance with the second embodiment of the application. The power-rail clamp circuit 210 includes the resistor 212, the capacitor 214, an inverter 220 and an NMOS transistor 230. The inverter 220 has an input terminal coupled to a common node of the resistor 212 and capacitor 214, and an output terminal coupled to a gate of the NMOS transistor 230. The NMOS transistor 230 has a drain coupled to the first power rail VDD1 and a source coupled to the first ground rail VSS1. It is noted that FIG. 2B is merely an example of the second embodiment, the present invention is not limited thereto.

Third Embodiment

Figure 3:
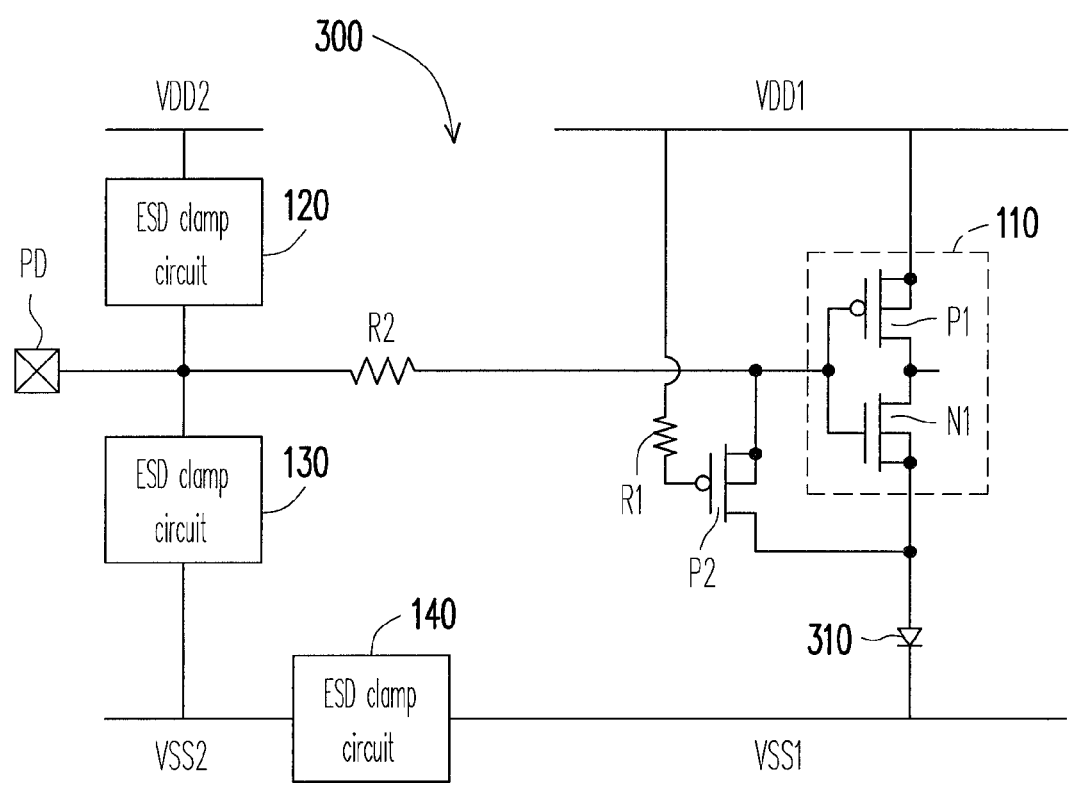
FIG. 3 shows a circuit 300 capable of ESD protection in accordance with the third embodiment of the application.
Figure 4:
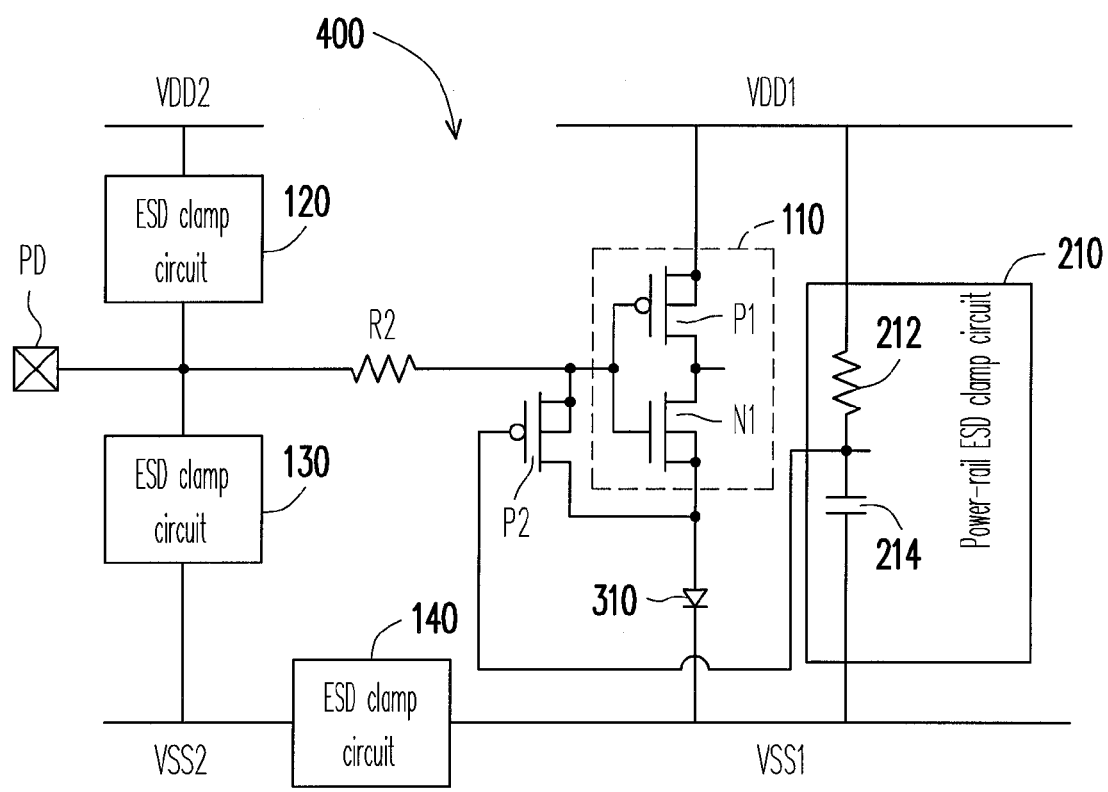
FIG. 4 shows another circuit 400 capable ESD protection in accordance with the third embodiment of the application.

According to another embodiment of the present application, the ESD protection designs can be implemented by an additional PMOS circuit in conjunction with a source loading (for example, resistor, diode, or MOS), as shown in FIGS. 3-6. Referring to FIG. 3, FIG. 3 shows a circuit 300 capable of ESD protection in accordance with the third embodiment of the application. The difference between the circuit 300 and circuit 100 as shown in FIG. 1 is mainly a diode 310, the diode 310 has a anode coupled to the source of the first NMOS transistor N1, and a cathode coupled to the first ground rail VSS1. Similarly, the diode 310 can also be added to the circuit 200 as shown in FIG. 2A. Referring to FIG. 4, FIG. 4 shows another circuit 400 capable of ESD protection in accordance with the third embodiment of the application. The circuit 400 includes the diode 310 and the power-rail clamp circuit 210, wherein the diode 310 is coupled between the first NMOS N1 and the first ground rail VSS1.

Figure 5:
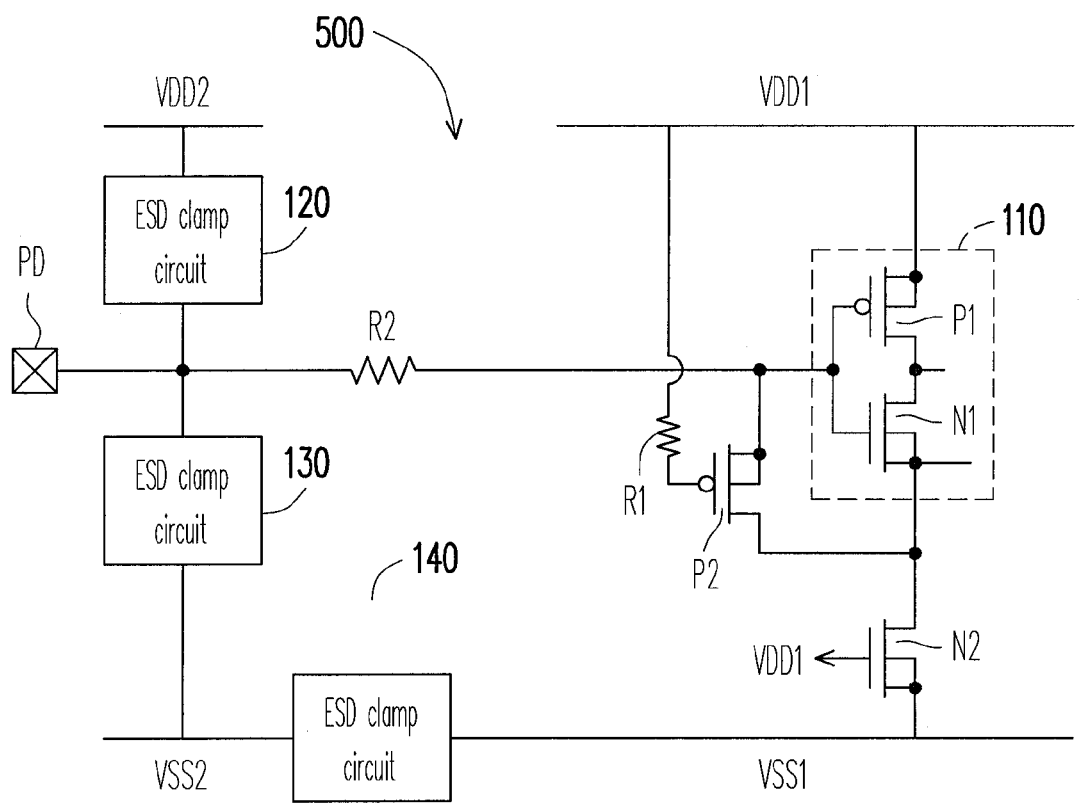
FIG. 5 shows a circuit 500 capable of ESD protection in accordance with the third embodiment of the present application.
Figure 6:
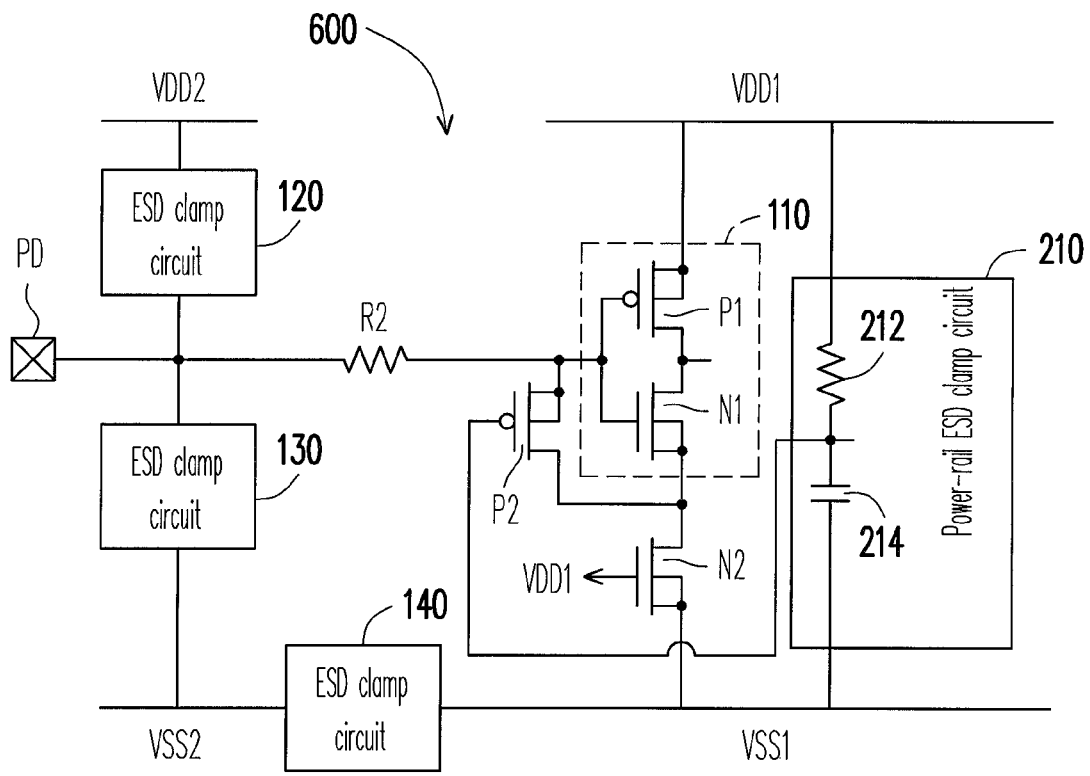
FIG. 6 shows a circuit 600 capable ESD protection in accordance with the third embodiment of the application.

FIG. 5 shows another circuit 500 capable of ESD protection in accordance with the third embodiment of the present application. The difference of the circuit 500 and the circuit 100 as shown in FIG. 1 is mainly a second NMOS transistor N2 which has a drain coupled to the source of the first NMOS transistor N1, and a source and a body both coupled to a first ground rail VSS1, and a gate coupled to the first power rail VDD1. Similarly, the second NMOS transistor N2 can also be added to the circuit 200 as shown in FIG. 2A. Referring to FIG. 6, FIG. 6 shows another circuit 600 capable ESD protection in accordance with the third embodiment of the application. The circuit 600 includes the second NMOS transistor N2 and the power-rail ESD clamp circuit 210, wherein the second NMOS transistor N2 is coupled between the first NMOS transistor N1 and the first ground rail VSS1, and has a gate coupled to the first power rail VDD1.

Figure 7:
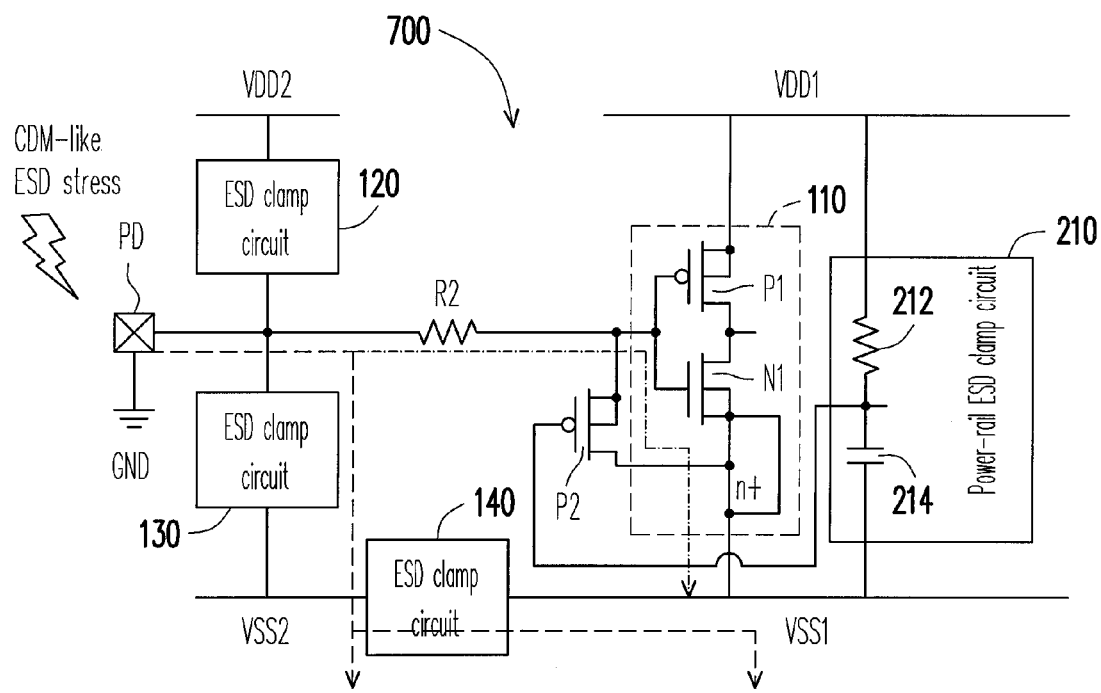
FIG. 7 shows a schematic diagram of ESD current paths of the circuit 200 under ESD stress in accordance with the third embodiment of the present application.

Next, please refer to FIG. 7. FIG. 7 shows a schematic diagram of ESD current paths of the circuit 700 under ESD stress in accordance with the third embodiment of the present application. When the input pad PD is suddenly grounded (connected to ground GND), charges are discharged from the substrate to the grounded input pad PD through several paths (dotted lines), as shown in FIG. 7. The ESD current is discharged through the power-rail ESD clamp 130 and the PMOS transistor P2 when a CDM-like ESD stress occurs at the input pad PD. Since the gate voltage of the PMOS transistor P2 is at a low voltage level, so the PMOS transistor P2 can be turned-on immediately and instantly conducts the ESD current to the first ground rail VSS1 to prevent the ESD current flowing through the first NMOS transistor N1.

Figure 8:
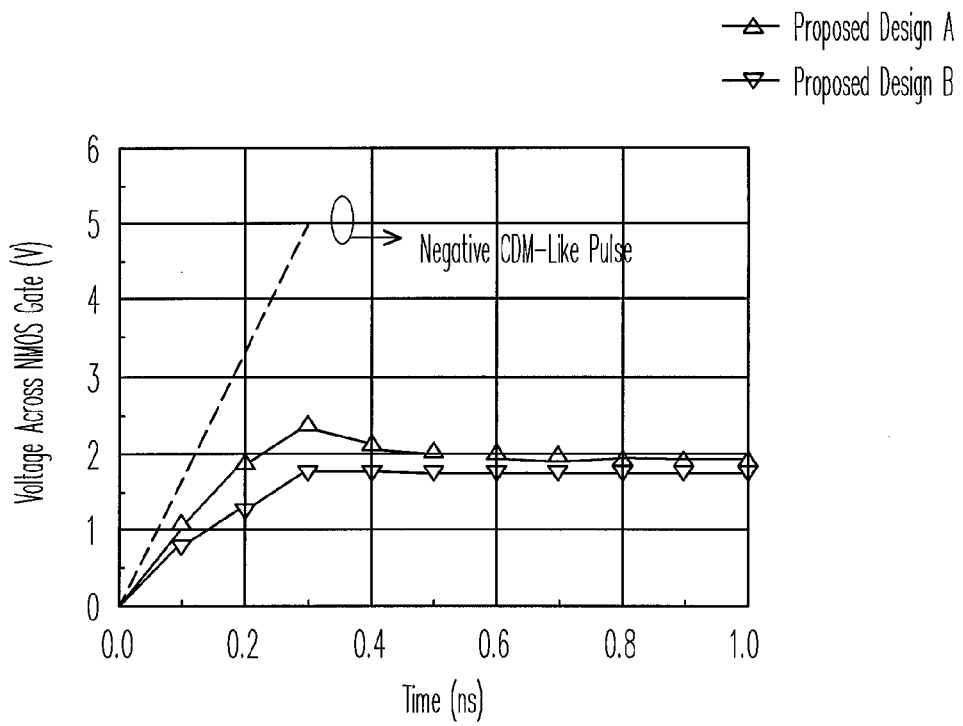
FIG. 8 and FIG. 9 show the simulated wave forms of the aforementioned ESD protection circuit under CDM-like transitions.
Figure 9:
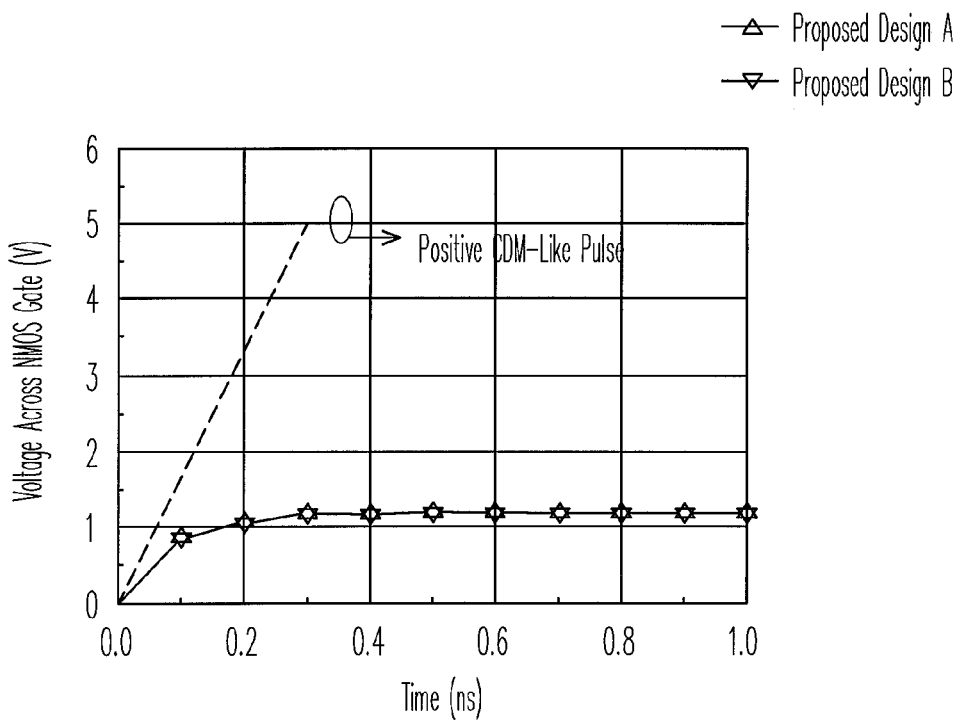

FIG. 8 and FIG. 9 show the simulated wave forms of the aforementioned ESD protection circuit under CDM-like transitions. In FIG. 8 and FIG. 9, the ±5 V voltage pulses with rise time of 0.3 ns are provided between the input pad PD and the P-substrate to simulate the fast transient voltage of a CDM ESD event. With a limited voltage height of 5 V in the voltage pulse, the voltage drop across the gate of the NMOS transistor N1 of all the aforementioned ESD protection circuits can be simulated to check the clamping performance. As shown in FIG. 8, when a negative CDM-like pulse is provided at the input pad PD, the voltage across the gate of the NMOS transistor N1 is not greater than 3 V during 0.2 ns. As shown in FIG. 9, when a positive CDM-like pulse is provided at the input pad PD, the voltage across the gate of the NMOS transistor N1 is not greater than 2 V during 0.2 ns. Therefore, with the proposed CDM ESD protection circuit as recited in above embodiments, the core circuit can be clamped at a lower voltage level under CDM stresses. It is noted that in FIGS. 8 and 9, the proposed design A and B represent respectively the ESD protection circuit as shown, for example, in FIGS. 1 and 2A.

As described above, the novel CDM ESD protection circuits with the initial-on mechanism and source pumping design have been proposed in the present application. Since only a transistor and a resistor are required to implement the CDM ESD protection circuit, the present application can effectively protect the core circuits from CDM ESD damages and further enhance the turn-on speed of the ESD protect circuit without increasing the layout region and circuit complexity.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge (ESD) protection circuit, suitable for an input stage circuit including a first N channel metal oxide semiconductor (NMOS) transistor, the ESD protection circuit comprising:
    a P channel metal oxide semiconductor (PMOS) transistor having a source coupled to a gate of the first NMOS transistor, and a drain coupled to a source of the first NMOS transistor;
    an impedance device, coupled between the gate of the PMOS transistor and a first power rail;
    a first ESD clamp circuit, coupled to a second power rail and the input pad;
    a second ESD clamp circuit, coupled to a second ground rail and the input pad; and
    a third ESD clamp circuit, coupled to a first ground rail and the second ground rail.

2. The ESD protection circuit according to claim 1, wherein the drain of the PMOS transistor is directly coupled to a heavily doped N-type (N+) diffusion region used to form the source of the first NMOS transistor, and coupled to a first ground rail through the N+ diffusion region.

3. The ESD protection circuit according to claim 1, further comprising a capacitor coupled to the impedance device and a first ground rail, wherein the gate of the PMOS transistor is coupled to a node between the impedance device and the capacitor.

4. The ESD protection circuit according to claim 3, further comprising:
    an inverter, coupled to the first power rail and the first ground rail, the inverter having an input terminal coupled to the node between the capacitor and the impedance device; and
    a transistor, coupled between the first power rail and the first ground rail, the transistor having a gate coupled to an output terminal of the inverter,
    wherein the capacitor, the impedance device, the inverter and the transistor form a power-rail ESD clamp circuit.

5. The ESD protection circuit according to claim 1, further comprising:
    a diode having an anode coupled to the source of the first NMOS transistor, and a cathode coupled to a first ground rail.

6. The ESD protection circuit according to claim 1, wherein the gate of the first NMOS transistor is coupled to an input pad.

7. The ESD protection circuit according to claim 1, wherein the input stage circuit further comprising:
    a first PMOS transistor having a source coupled to the first power rail, and a drain coupled to a drain of the first NMOS transistor, and a gate coupled to the gate of the first NMOS transistor.

8. The ESD protection circuit according to claim 1, wherein the PMOS transistor has a body coupled to the source of the PMOS transistor.

* * * * *